(12) United States Patent
Kim et al.

(10) Patent No.: US 10,803,919 B2
(45) Date of Patent: Oct. 13, 2020

(54) MEMORY CONTROLLER FOR CONTROLLING REFRESH OPERATION AND MEMORY SYSTEM INCLUDING THE SAME

(71) Applicant: SK hynix Inc., Gyeonggi-do (KR)

(72) Inventors: Joon-Woo Kim, Seoul (KR);
Hyun-Seok Kim, Gyeonggi-do (KR);
Young-Jae Jin, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/233,510

(22) Filed: Dec. 27, 2018

(65) Prior Publication Data

US 2019/0333566 A1 Oct. 31, 2019

(30) Foreign Application Priority Data

Apr. 30, 2018 (KR) .................. 10-2018-0049941

(51) Int. Cl.
*G11C 11/406* (2006.01)
*G11C 11/4096* (2006.01)
*G06F 11/10* (2006.01)
*G11C 7/10* (2006.01)

(52) U.S. Cl.
CPC .......... *G11C 11/406* (2013.01); *G06F 11/106* (2013.01); *G11C 7/109* (2013.01); *G11C 7/1063* (2013.01); *G11C 11/4096* (2013.01); *G11C 11/40615* (2013.01); *G11C 11/40618* (2013.01)

(58) Field of Classification Search
CPC ........ G11C 11/40615; G11C 11/40618; G11C 11/406; G11C 11/106
See application file for complete search history.

(56) References Cited

U.S. PATENT DOCUMENTS

| | | | | |
|---|---|---|---|---|
| 4,493,081 A * | 1/1985 | Schmidt | ................. | G06F 11/106 714/754 |
| 6,704,230 B1 * | 3/2004 | DeBrosse | ............. | G06F 11/106 365/158 |
| 2009/0016134 A1 * | 1/2009 | Fukuda | ................. | G11C 11/404 365/222 |
| 2010/0106901 A1 * | 4/2010 | Higeta | .................. | G06F 11/106 711/106 |
| 2014/0211579 A1 * | 7/2014 | Lovelace | .......... | G11C 11/40607 365/200 |
| 2015/0162066 A1 * | 6/2015 | Song | ................. | G11C 11/40611 365/222 |
| 2019/0318777 A1 * | 10/2019 | Kim | .................. | G11C 11/40626 |

FOREIGN PATENT DOCUMENTS

| KR | 100700156 | 3/2007 |
|---|---|---|
| KR | 101043013 | 6/2011 |

* cited by examiner

*Primary Examiner* — Amir Zarabian
(74) *Attorney, Agent, or Firm* — IP & T Group LLP

(57) ABSTRACT

A memory system includes a memory module comprising a plurality of memory devices, and a memory controller suitable for controlling the plurality of memory devices to perform a refresh operation or performing an error correction code (ECC) operation on the plurality of memory devices, according to a refresh operation request.

20 Claims, 3 Drawing Sheets

MEMORY CONTROLLER FOR CONTROLLING REFRESH OPERATION AND MEMORY SYSTEM INCLUDING THE SAME

CROSS-REFERENCE TO RELATED APPLICATION

This application claims priority under 35 U.S.C. § 119(a) to Korean Patent Application No. 10-2018-0049941, filed on Apr. 30, 2018, which is incorporated herein by reference in its entirety.

BACKGROUND

1. Field

The present disclosure relates to a memory controller for controlling a refresh operation of a memory module, and a memory system including the same.

2. Discussion of the Related Art

A memory system is applied to various consumer and industrial electronic devices, for example, a computer, mobile phone, portable digital assistant (PDA), digital camera, game machine, navigation system, and the like. Such a memory system may be used as a main memory device or auxiliary memory device. The memory device itself may be a volatile memory device such as a dynamic random access memory (DRAM) or static RAM (SRAM), or a nonvolatile memory device such as a read only memory (ROM), mask ROM (MROM), programmable ROM (PROM), erasable programmable ROM (EPROM), electrically erasable programmable ROM (EEPROM), ferroelectric RAM (FRAM), phase-change RAM (PRAM), magnetoresistive RAM (MRAM), resistive RAM (RRAM), or flash memory.

Among the memory devices, the DRAM has been continuously scaled down according to the demands for implementing a larger memory capacity using a smaller chip. Furthermore, with the increase of the capacity and operating speed which are required by memory systems, the DRAM is packaged according to the memory system in which it is installed. For example, a DRAM installed in a personal computer (PC) or the like is packaged in the form of module integrated on a printed circuit board (PCB), and mounted in the PC through a slot. Among memory modules which are packaged according to the memory system, a dual in-line memory module (DIMM) is commonly used. The DIMM which can be used as a main memory in a computing platform may include a plurality of DRAMs mounted in parallel.

With the continued development of the memory system, the number of DRAMs included in one memory module is gradually increasing. However, since the DRAM needs to periodically perform a refresh operation, the number of refresh operations which need to be performed within a predetermined time is increased in the case where the capacity of the memory module is increased. As a result, the performance of the memory system may be reduced while the power consumption thereof is increased. The refresh operation cycle of the DRAM may limit the increase in capacity of the memory module.

SUMMARY

Various embodiments are directed to a memory controller capable of controlling a large-capacity memory module without performance degradation by adjusting a refresh operation cycle of the memory module, and a memory system including the same.

In accordance with an embodiment of the present invention, a memory system includes: a memory module comprising a plurality of memory devices; and a memory controller suitable for controlling the plurality of memory devices to perform a refresh operation or performing an error correction code (ECC) operation on the plurality of memory devices, according to a refresh operation request.

In accordance with an embodiment of the present invention, a memory controller includes: a refresh controller suitable for generating an enabled first set signal whenever a refresh operation request is received, and generating a refresh command instead of the enabled first set signal whenever the refresh operation request is received a set number of times; and a patrol scrub component suitable for controlling a plurality of memory devices to alternately perform operations of reading data from the memory devices and writing the read data to the memory devices in response to the enabled first set signal, wherein the patrol scrub component detects and corrects an error of the read data through an error correction code (ECC) operation.

In accordance with an embodiment of the present invention, an operation method for a memory system includes: generating a count value by performing a counting operation, whenever a refresh operation request is received; comparing the generated count value with a reference value; generating an enabled first set signal or a refresh command, based on the comparison result; and alternately performing read and write operations in response to the enabled first set signal.

In accordance with an embodiment of the present invention, a memory system includes: a memory module including a plurality of memory devices; and a memory controller suitable for: receiving and counting refresh operation requests; controlling the plurality of memory devices to perform a refresh operation on the plurality of memory devices in response to each multiple of K refresh operation request received, where K is an integer greater than or equal to 2; and controlling the plurality of memory devices to perform an error correction operation on the plurality of memory devices in response to each of the other refresh operation requests received.

DETAILED DESCRIPTION

Figure 1:
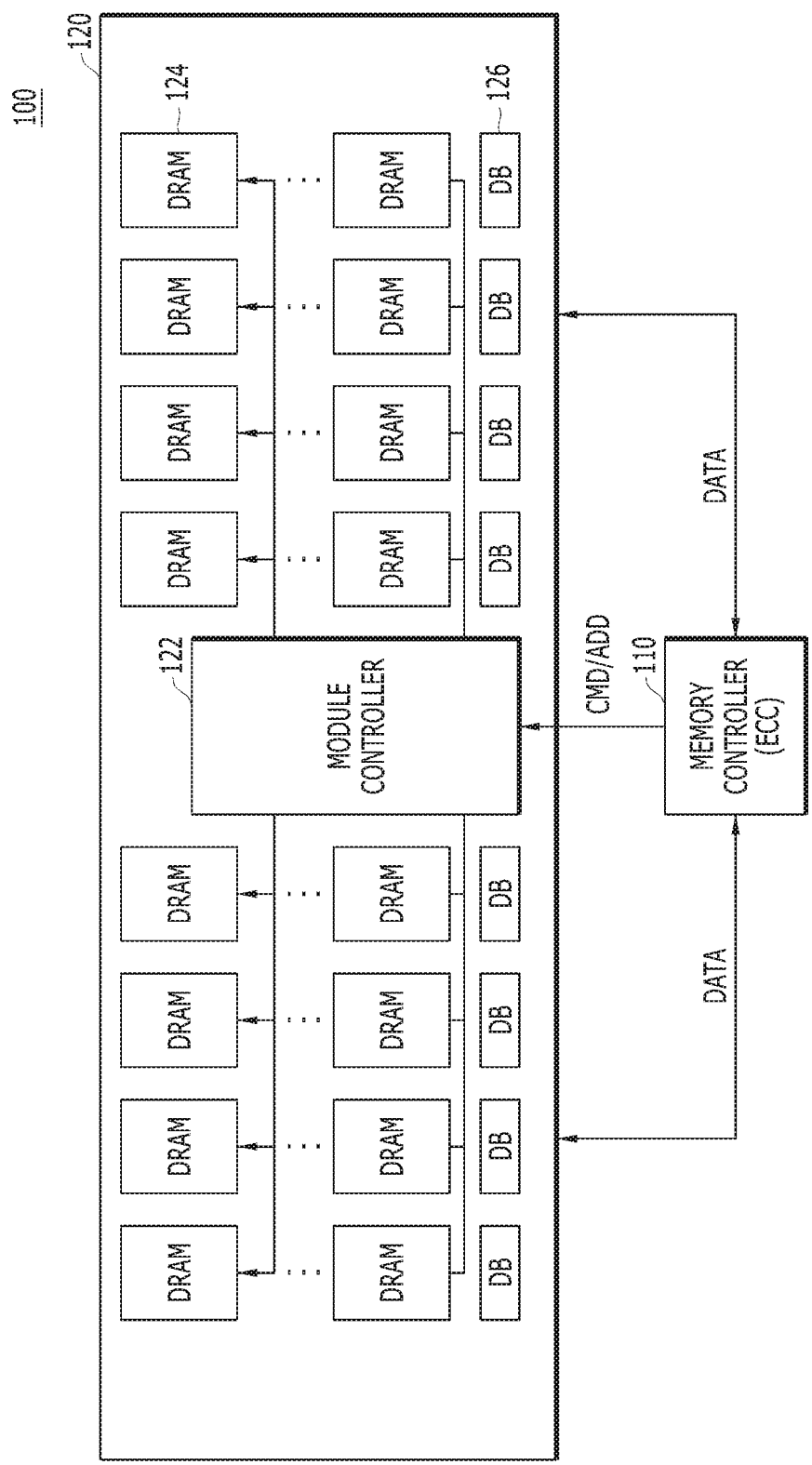
FIG. 1 is a block diagram illustrating a memory system in accordance with an embodiment of the present invention.

Various embodiments will be described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

FIG. 1 is a block diagram illustrating a memory system 100 in accordance with an embodiment of the present invention. Referring to FIG. 1, the memory system 100 may include a memory controller 110 and a memory module 120.

The memory controller 110 may control the operation of the memory module 120 in response to a request from a host (not illustrated). For example, the memory controller 110 may store data DATA provided from the host in the memory module 120, and provide the data DATA read from the memory module 120 to the host. For this operation, the memory controller 110 may generate a command CMD and address ADD, and transmit the generated command CMD and address ADD to the memory module 120.

The memory module 120 may include a module controller 122, a plurality of memory devices 124 and a plurality of data buffers (DBs) 126. In some embodiments, each of the memory devices 124 may be implemented with a dynamic random access memory (DRAM). The module controller 122 may generate control signals for controlling the memory devices 124 in response to the command CMD and address ADD received from the memory controller 110. The module controller 122 may provide the memory devices 124 with the control signals. For example, the module controller 122 may include a register clock driver (RCD).

The memory devices 124 may receive the data DATA from the data buffers 126 according to the control signals provided by the module controller 122, or output the data DATA stored therein to the data buffers 126. That is, the memory devices 124 may directly transmit the data DATA to, and receive the data DATA from, the memory controller 110 through the data buffers 126.

The memory controller 110 may control refresh operations of the memory devices 124. In order to retain data of memory cells included in the memory devices 124, the memory controller 110 may control the memory devices 124 to perform a refresh operation in a refresh cycle, which may be predetermined. However, as the number of the memory devices 124 mounted in the memory module 120 is increased, the time it takes for all of the memory devices 124 to perform refresh operations within a refresh cycle is increased, and the number of errors introduced also may be increased. Therefore, by additionally performing an error correction code (ECC) operation, the memory controller 110 may detect a memory cell in which an error occurred, and correct the detected data. Such an operation is referred to as a patrol scrub operation.

For example, the memory system 100 may include a managed DRAM solution (MDS) memory system. Each of the memory devices 124 may include a plurality of memory chips stacked therein. Therefore, the capacities of the memory devices 124 may be increased in proportion to the number of stacked memory chips. However, there is a limitation (i.e., increased refresh time and/or more errors) for the memory devices 124 to refresh the entire memory chips within a predetermined refresh cycle. As a result, the memory controller 110 may control the memory devices 124 to perform a refresh operation in an increased refresh cycle, and compensate for an error caused by the increased refresh cycle through the patrol scrub operation.

When one memory device includes eight memory chips, the time required for refreshing the entire memory device may be increased eight times, compared to when the memory device includes one memory chip. Therefore, the refresh cycle of each of the memory chips may also be increased eight times. The memory controller 110 may detect and correct an error caused by the increase of the refresh cycle by performing the patrol scrub operation on the memory devices 124.

The memory controller 110 may be operated in such a manner that the host recognizes the memory system 100 as one memory device with a large capacity. That is, the host may request a refresh operation in a refresh cycle which is not increased, and the memory controller 110 may generate a refresh command (CMD) only for some requests and transmit the refresh command (CMD) to the memory module 120. The memory controller 110 may perform the patrol scrub operation on the other requests.

For example, when the refresh cycle is increased eight times, the memory controller 110 may generate one refresh command (CMD) while eight refresh operations are requested by the host. Furthermore, the memory controller 110 may perform the patrol scrub operation on seven refresh operation requests.

Figure 2:
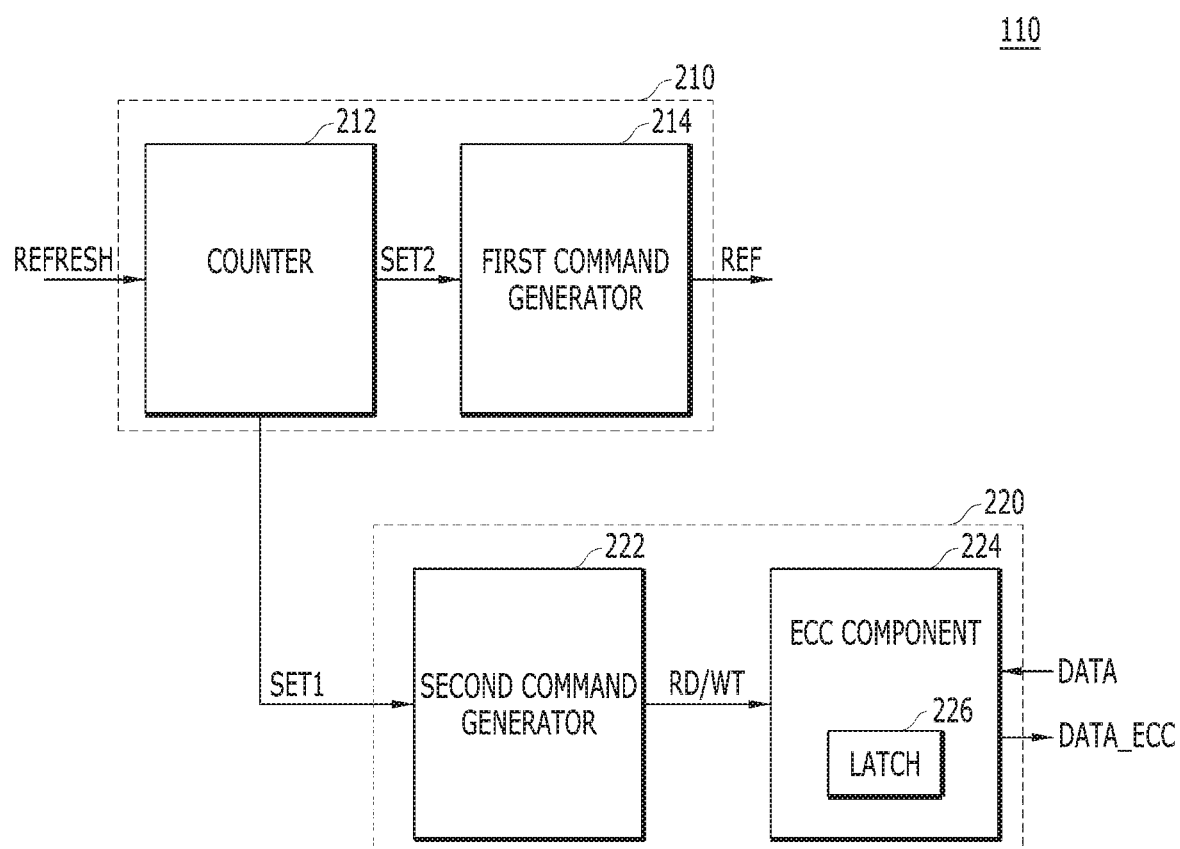
FIG. 2 is a block diagram illustrating a memory controller in accordance with an embodiment of the present invention.

FIG. 2 is a block diagram illustrating a memory controller in accordance with an embodiment of the present invention, for example, the memory controller 110 of FIG. 1. According to a refresh operation request REFRESH from a host (not shown), the memory controller 110 may control the plurality of memory devices 124 to perform either a refresh operation or an error correction code (ECC) operation on the memory devices 124.

Referring to FIG. 2, the memory controller 110 may include a refresh controller 210 and a patrol scrub component 220. The refresh controller 210 may generate an enabled first set signal SET1 whenever the refresh operation is requested, and generate a refresh command REF instead of the enabled first set signal SET1 whenever the refresh operation is requested a set number of times, which number may be predetermined.

The patrol scrub component 220 may alternately perform read and write operations on the memory devices 124 in response to the first set signal SET1. That is, the patrol scrub component 220 may read the data DATA from the memory devices 124, and rewrite the read data DATA to the memory devices 124. The patrol scrub component 220 may detect and correct an error of the read data DATA through the ECC operation, and write the error-detected and corrected data DATA_ECC.

More specifically, the refresh controller 210 may include a counter 212 and a first command generator 214. The patrol scrub component 220 may include a second command generator 222 and an error correction code (ECC) component 224. In accordance with another embodiment, the first command generator 214 and the second command generator 222 may form a command generator. This configuration will be described below again.

Whenever the refresh operation is requested, the counter 212 may perform a counting operation, and generate the enabled first set signal SET1 in accordance with to the counting operation. Whenever the refresh operation is requested by the set number of times, the counter 212 may generate an enabled second set signal SET2, instead of the enabled first set signal SET1, based on the counting operation. In response to the enabled second set signal SET2, the first command generator 214 may generate the refresh command REF.

In response to the enabled first set signal SET1, the second command generator 222 may alternately generate a read command RD and a write command WT. That is, the second command generator 222 may generate the read command RD when the enabled first set signal SET1 is generated an odd number of times, and generate the write command WT when the enabled first set signal SET1 is generated an even number of times.

In accordance with an embodiment, the enabled first set signal SET1 may include a count value obtained through the counting operation performed by the counter 212. The second command generator 222 may generate the read command RD when the count value is an odd value, and generate the write command WT when the count value is an even value.

In accordance with another embodiment, the enabled first set signal SET1 may include flag information. The counter 212 may enable or disable the flag information whenever the counting operation is performed. The second command generator 222 may generate the read command RD when the flag information is enabled, and generate the write command WT when the flag information is disabled.

According to the read command RD, the data DATA may be read from the memory devices 124. In response to the read command RD, the ECC component 224 may perform an ECC operation on the read data DATA. Through the ECC operation, an error of the read data DATA may be detected and corrected.

The ECC component 224 may include a latch 226 to store the error-detected and corrected data DATA_ECC. In response to the write command WT, the ECC component 224 may output the error-detected and corrected data DATA_ECC. According to the write command WT, the memory devices 124 may store the error-detected and corrected data DATA_ECC again.

In accordance with another embodiment, the first command generator 214 and the second command generator 222 may form the command generator as described above. Whenever a refresh operation is requested, the counter 212 may generate the set signals SET1 and SET2 by performing a counting operation. In response to the set signals SET1 and SET2, the command generator may generate the refresh command REF, the read command RD or the write command WT.

Specifically, whenever a refresh operation is requested, the counter 212 may generate the enabled first set signal SET1 by performing a counting operation; however, when the refresh operation is requested the set number of times, the counter 212 may generate the enabled second set signal SET2 instead of the enabled first set signal SET1, based on the counting operation.

In response to the enabled first set signal SET1, the command generator may alternately generate the read command RD and the write command WT. In response to the enabled second set signal SET2, the command generator may generate the refresh command REF. Since the operation of the ECC component 224 based on the read command RD and the write command WT has been described above, further description thereof is omitted here.

In accordance with an embodiment, the memory controller 110 may transmit the refresh command REF to the memory devices 124, and each of the memory devices 124 may perform a refresh operation based on the refresh command REF. That is, according to the refresh command REF, each of the memory devices 124 may perform a counting operation generating a counted or incremented address (an address to be refreshed) and refresh the counted address.

In accordance with another embodiment, the memory controller 110 may generate the counted address ADD while counting the refresh operation request REFRESH. That is, the memory controller 110 may further include an address generator (an address counter not illustrated), and generate the address ADD which is increased one by one (incremented) based on the counting operation of the counter 212. The generated address ADD may be transmitted along with the refresh command REF, the read command RD and the write command WT, and used for the refresh operation and the ECC operation.

FIG. 2 illustrates only a read command RD and a write command WT, which are transmitted from the memory controller 110 for respective read and write operations of the memory devices 124. However, the memory controller 110 may transmit an active command before the read command RD and the write command WT, and transmit a precharge command after the read command RD and the write command WT.

This processing is omitted for clarity, but the memory controller 110 may decide generation timings of the series of commands through a command scheduler, and secure a sufficient margin. For example, in the case of a double data rate 4 (DDR4) memory module, a refresh operation cycle tRFC corresponding to one refresh command REF received from a host may be set to 400 ns. The time required for a smart refresh operation may also fall within an operation cycle of 200 ns. Since 60 ns is required until target memory cells are activated and then precharged after data are read from, or written to, the activated target memory cells, the memory controller 110 may generate commands (including active and precharge commands) for a read or write operation and transmit the generated commands within one refresh operation period.

Figure 3:
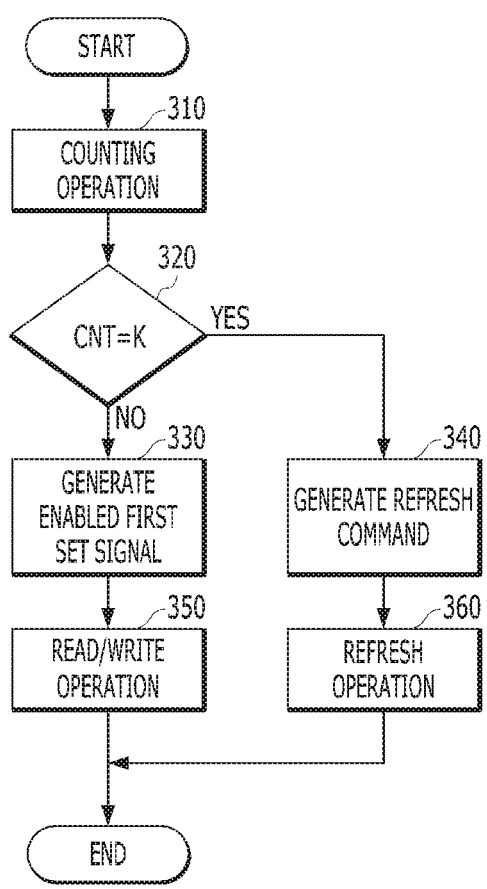
FIG. 3 is a flowchart illustrating an operation of a memory system in accordance with an embodiment of the present embodiment.

FIG. 3 is a flowchart illustrating an operation of a memory system in accordance with an embodiment of the present invention, for example, the memory system 100 of FIG. 1.

1) Counting operation S310.

Whenever a refresh operation is requested from a host, that is, whenever a refresh operation request REFRESH is received from the host, the counter 212 of FIG. 2 may perform a counting operation. According to the refresh operation request REFRESH, the counter 212 may perform a counting operation, that is, increase a count value CNT by one, and store the increased count value CNT.

2) Count comparison S320.

The counter 212 may compare the count value CNT to a reference value K. The reference value K is a natural number greater than or equal to 2. In an embodiment, the reference value K is 8.

3) First set signal generation S330.

Based on the comparison result, the counter 212 may generate the enabled first set signal SET1. That is, when the count value CNT is not equal to the reference value K (NO at step S320), the counter 212 may generate the enabled first set signal SET1. Therefore, whenever the refresh operation is requested, except when CNT is equal to K, e.g., 8, or multiple thereof, the counter 212 may generate the first set signal SET1.

4) Refresh command generation S340.

Based on the comparison result, the counter 212 may generate the enabled second set signal SET2. That is, when the count value CNT is equal to the reference value K (YES at step S320), the counter 212 may generate the enabled second set signal SET2, and reset the count value CNT. Therefore, whenever the refresh operation is requested a number of times corresponding to a multiple of 8 (i.e., 8, 16, 24, . . . ), the counter 212 may generate the enabled second set signal SET2. In response to the enabled second set signal SET2, the first command generator 214 may generate the refresh command REF.

5) Read/write operations S350.

In response to the enabled first set signal SET1, which is generated multiple times, the patrol scrub component 220 may alternately perform read and write operations. For this operation, the second command generator 222 may generate the read command RD in response to an odd-numbered enabled first set signal SET1, and generate the write command WT in response to an even-numbered enabled first set signal SET1. The memory controller 110 may control the plurality of memory devices 124 to perform the read operation by transmitting the read command RD to the plurality of memory devices 124 or to perform the write operation by transmitting the write command WT to the plurality of memory devices 124.

In response to the generated read command RD, the ECC component 224 may detect and correct an error of the read data DATA. The ECC component 224 may perform an ECC operation to detect and correct an error of the read data DATA. The ECC component 224 may store the error-detected and corrected data DATA_ECC therein, and output the same to the plurality of memory devices 124 in response to the generated write command WT.

6) Refresh operation S360.

In response to the generated refresh command REF, the plurality of memory devices 124 may perform the refresh operation. That is, when the refresh operation is requested by the number of times corresponding to a multiple of 8 while the read/write operations are alternately performed whenever the refresh operation is requested, the plurality of memory devices 124 may perform the refresh operation.

In accordance with the present embodiment, whenever a multiple of eight refresh operations are requested from the host, the plurality of memory devices 124 performs one refresh operation, because at those times the count value CNT is equal to a multiple of 8. In response to the other refresh operation requests, the read/write operations may be alternately performed. During the read/write operations, the memory controller 110 may perform the ECC operation to detect and correct an error of the read data.

Therefore, by performing the refresh operation and the ECC operation at the same time, the memory controller 110 may detect data error(s), which are not corrected through the refresh operation, and correct the detected error(s) before they exceed a correctable limit. Therefore, the efficiency of the refresh operation may be increased, and the refresh operation cycle of the large-capacity memory module may be increased.

Furthermore, the memory controller 110 may generate the target address ADD of the refresh operation and/or the patrol scrub operation based on the counting operation of the counter 216, and transmit the target address ADD to the memory devices 124. Whenever the refresh operation and/or the patrol scrub operation are/is performed, the memory controller 110 may update the target address ADD by increasing the target address ADD by one based on the counting operation.

In accordance with embodiments, the memory system may detect and correct an error in stored or retained data, which is not corrected through a refresh operation, by performing the refresh operation and the ECC operation at the same time. Therefore, the memory system may prevent an ECC fail which may occur when data errors exceed the correctable limit. Therefore, the efficiency of the refresh operation may be increased, and the refresh operation cycle may be increased, which makes it possible to reduce power consumption by the refresh operation in the large-capacity memory module.

Although various embodiments have been described and illustrated, it will be apparent to those skilled in the art in light of the present disclosure that various changes and modifications may be made without departing from the spirit and scope of the invention as defined in the following claims.

What is claimed is:

1. A memory system comprising:
   a memory module comprising a plurality of memory devices; and
   a memory controller configured to control the plurality of memory devices to perform a refresh operation or an error correction code (ECC) operation on the plurality of memory devices, according to a refresh operation request, while alternately generating a read command and a write command in response to the refresh operation request.

2. The memory system of claim 1, wherein the memory controller comprises:
   a counter configured to perform a counting operation and generate an enabled set signal corresponding to the counting operation whenever the refresh operation request is received;
   a command generator configured to generate a refresh command, the read command or the write command in response to the enabled set signal; and
   an ECC component configured to detect and correct an error of read data in response to the read command, and output the error-corrected data in response to the write command.

3. The memory system of claim 2, wherein the counter generates an enabled first set signal whenever the refresh operation request is received, and generates an enabled second set signal instead of the enabled first set signal based on the counting operation, whenever the refresh operation request is received a set number of times.

4. The memory system of claim 3, wherein the command generator alternately generates the read command and the write command in response to the enabled first set signal, and generates the refresh command in response to the enabled second set signal.

5. The memory system of claim 3,
   wherein the enabled first set signal is associated with a count value as a result of the counting operation, and
   wherein the command generator generates the read command when the count value is an odd value, and generates the write command when the count value is an even value.

6. The memory system of claim 3,
   wherein the enabled first set signal comprises flag information which is enabled/disabled whenever the refresh operation request is received, and
   wherein the command generator generates the read command when the flag information is enabled, and generates the write command when the flag information is disabled.

7. The memory system of claim 2, wherein the ECC component comprises:
   a latch configured to store the error-detected and corrected data.

8. The memory system of claim 2, wherein the memory controller further comprises:
   an address generator configured to generate an address which is increased by one based on the counting operation and output the generated address to the memory devices, whenever the refresh operation request is received.

9. The memory system of claim 1, wherein the memory controller controls the plurality of memory devices to perform one refresh operation in response to the refresh operation request having been received K times, where K is a natural number greater than equal to 2.

10. A memory controller comprising:
a refresh controller configured to generate an enabled first set signal whenever a refresh operation request is received, and generate a refresh command instead of the enabled first set signal whenever the refresh operation requested is received a set number of times; and
a patrol scrub component configured to control a plurality of memory devices to alternately perform operations of reading data from the memory devices and writing data to the memory devices in response to the enabled first set signal,
wherein the patrol scrub component generates error-corrected data by detecting and correcting an error of the read data through an error correction code (ECC) operation and writes the error-corrected data to the memory devices in the writing operation.

11. The memory controller of claim 10, wherein the refresh controller comprises:
a counter configured to perform a counting operation and generate the enabled first set signal whenever the refresh operation request is received, and generate an enabled second set signal instead of the enabled first set signal based on the counting operation, whenever the refresh operation request is received the set number of times; and
a first command generator configured to generate the refresh command in response to the second set signal.

12. The memory controller of claim 10, wherein the patrol scrub component comprises:
a second command generator configured to alternately generate read and write commands in response to the enabled first set signal; and
an ECC component configured to detect and correct the error of the read data by performing the ECC operation in response to the read command, and output the error-corrected data in response to the write command.

13. An operation method of a memory system, comprising:
receiving and counting refresh requests, wherein a count value is generated when receiving each refresh request;
generating a comparison result by comparing the count value with a reference value;
generating an enabled first set signal or a refresh command based on the comparison result; and
alternately performing read and write operations in response to the enabled first set signal.

14. The operation method of claim 13, wherein the generating of the enabled first set signal or the refresh command comprises:
generating the enabled first set signal when the count value is not equal to the reference value; and
generating an enabled second set signal and resetting the count value when the count value is equal to the reference value.

15. The operation method of claim 14, wherein the generating of the enabled first set signal or the refresh command further comprises:
generating the refresh command in response to the enabled second set signal.

16. The operation method of claim 13, wherein the alternately performing of the read and write operations in response to the enabled first set signal comprises:
generating a read command when the enabled first set signal is generated an odd number of times; and
generating a write command when the enabled first set signal is generated an even number of times.

17. The operation method of claim 16, wherein the alternately performing of the read and write operations in response to the enabled first set signal further comprises:
detecting and correcting an error of read data in response to the generated read command; and
outputting the error-corrected data in response to the generated write command.

18. The operation method of claim 17, wherein the detecting and correcting of the error of the read data is carried out by performing an error correction code (ECC) operation.

19. The operation method of claim 13, further comprising:
performing, by a plurality of memory devices, the refresh operation in response to the generated refresh command.

20. The operation method of claim 19, wherein the read and write operations are alternately performed whenever the refresh operation request is received and the refresh operation is performed instead whenever the refresh operation request is received a set number of times.

* * * * *